United States Patent
Londak et al.

(10) Patent No.: US 11,387,811 B2
(45) Date of Patent: Jul. 12, 2022

(54) NOISE FILTER

(71) Applicant: SEMICONDUCTOR COMPONENTS INDUSTRIES, LLC, Phoenix, AZ (US)

(72) Inventors: Pavel Londak, Hutisko Solanec (CZ); Jan Matej, Ostrava (CZ); Petr Rozsypal, Hutisko-Solanec (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/949,167

(22) Filed: Oct. 16, 2020

(65) Prior Publication Data

US 2022/0123734 A1 Apr. 21, 2022

(51) Int. Cl.
| | |
|---|---|
| *H03H 11/00* | (2006.01) |
| *H03H 11/04* | (2006.01) |
| *H03H 7/06* | (2006.01) |

(52) U.S. Cl.
CPC .......... *H03H 11/0472* (2013.01); *H03H 7/06* (2013.01); *H03H 11/00* (2013.01)

(58) Field of Classification Search
CPC .............................. H03H 11/0472; H03H 7/06
See application file for complete search history.

(56) References Cited

U.S. PATENT DOCUMENTS

| | | | |
|---|---|---|---|
| 4,994,774 A | 2/1991 | Joosse | |
| 5,999,043 A * | 12/1999 | Zhang | H03H 1/02 327/308 |
| 6,417,725 B1 * | 7/2002 | Aram | H02M 3/073 327/541 |
| 7,362,081 B1 * | 4/2008 | Huang | G05F 1/575 323/282 |
| 7,920,005 B2 * | 4/2011 | Yazicioglu | H03F 3/45475 327/276 |
| 8,289,009 B1 * | 10/2012 | Strik | G05F 1/575 323/272 |
| 9,448,574 B2 * | 9/2016 | Motz | G05F 1/575 |
| 9,627,879 B2 * | 4/2017 | Zamprogno | H02H 3/207 |

(Continued)

OTHER PUBLICATIONS

Semiconductor Components Industries, LLC, NCP59748, Linear Regulator—Dual-Rail, Very Low-Dropout, Programmable Soft-Start, Oct. 2019.

*Primary Examiner* — Dinh T Le
(74) *Attorney, Agent, or Firm* — Brake Hughes Bellermann LLP

(57) ABSTRACT

Some applications require a noise filter to have a very low cutoff frequency. The low cutoff frequency can require the use of a large resistor that is not suitable for integration in an integrated circuit (IC) package. Smaller components can be used to provide a large resistance in a first direction but not in another. In other words, the resistance of these smaller components may be non-reciprocal. A non-reciprocal resistance can affect a response of the noise filter to disruptions at the input or the output. Additionally, these smaller components may not be suitable for low voltage operation. A noise filter is disclosed that provides a high resistance using components that can be included in an integrated circuit package. The noise filter has a reciprocal effective resistance and can utilize technology suitable for low voltage operation.

19 Claims, 10 Drawing Sheets

(56) References Cited

U.S. PATENT DOCUMENTS

2011/0274290 A1* 11/2011 Holzmann .............. H03F 1/305
                                                        381/94.1
2014/0253206 A1*  9/2014 Tang ..................... H03H 11/04
                                                        327/311

* cited by examiner

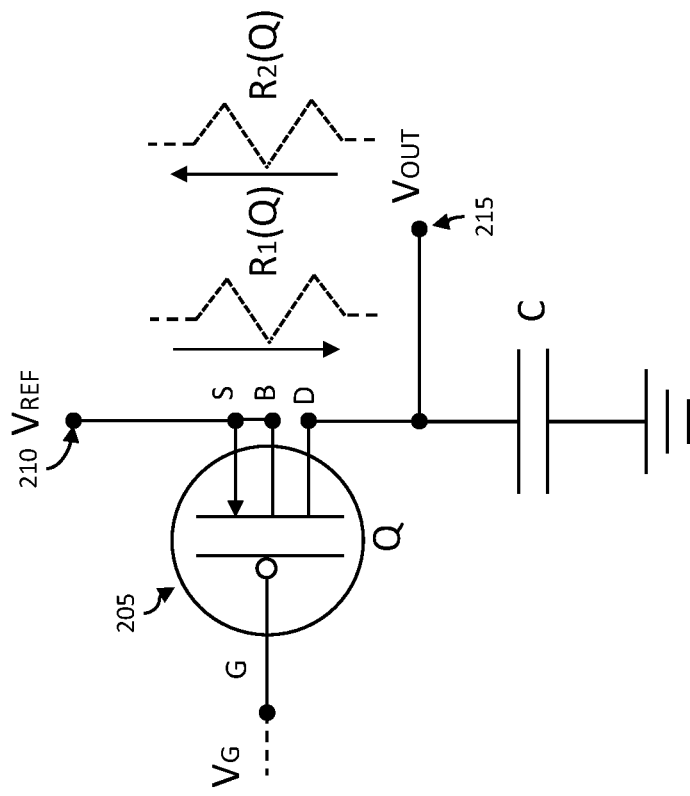
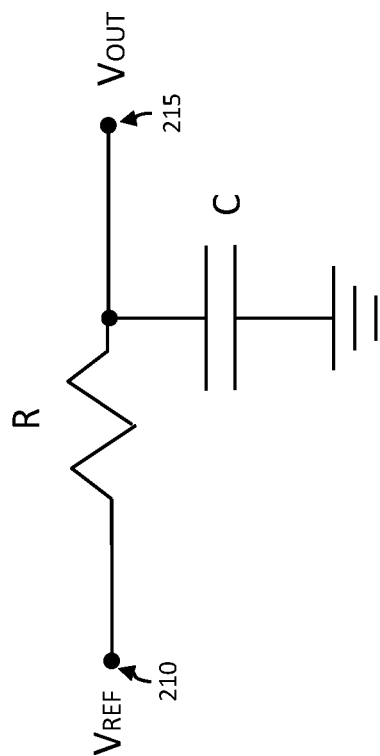
FIG. 2B
FIG. 2A

NOISE FILTER

FIELD OF THE DISCLOSURE

The present disclosure relates to analog microelectronics and more specifically to a circuit for noise filtering that utilizes transistors to provide a reciprocal resistance.

BACKGROUND

Resistor-capacitor filters (i.e., RC-filters) may be used to reduce/remove noise from a signal. For example, an RC low-pass (LP) filter may be used after a voltage reference to prevent high-frequency noise from interfering with a reference voltage. For such applications, it may be desirable for a cutoff (i.e., corner) frequency of the RC-filter to be very low. The low cutoff frequency can be provided by a high resistance and/or a high capacitance in the RC-filter. The high resistance and/or high capacitance, however, may require more area (i.e., integrated circuit area, die area) than convenient for a fully integrated implementation of the RC-filter.

SUMMARY

In at least one aspect, the present disclosure generally describes a noise filter. The noise filter includes a first transistor that is coupled between an input terminal and a bulk node and a first capacitor that is coupled between the bulk node and a ground. The noise filter further includes a second transistor coupled between the bulk node and an output terminal and a second capacitor coupled between the output terminal and the ground.

In another aspect, the present disclosure generally describes a system for regulating a voltage. The system includes a low dropout voltage regulator (LDO) that is configured to compare a filtered reference voltage to an output voltage. The system further includes a voltage reference that is configured to generate an unfiltered reference voltage. The system further includes a noise filter that is configured to receive the unfiltered reference voltage and to generate the filtered reference voltage. The noise filter includes a first transistor that is coupled between an input terminal and a bulk node and a first capacitor that is coupled between the bulk node and a ground. The noise filter further includes a second transistor coupled between the bulk node and an output terminal and a second capacitor coupled between the output terminal and the ground.

In another aspect, the present disclosure generally describes a method for noise filtering. The method includes receiving an input voltage at a noise filter. The noise filter includes a capacitance and resistances provided by a first transistor and a second transistor. The method includes configuring the resistances provided by the first transistor and the second transistor to increase a charging rate of the capacitance when the input voltage is made larger than an output voltage. The method further includes configuring the resistances provided by the first transistor and the second transistor to decrease a discharging rate of the capacitance when the input voltage is made smaller than the output voltage.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 2A schematically illustrates an RC-filter having a resistance that is reciprocal.

FIG. 2B schematically illustrates an RC-filter having a resistance that is not reciprocal.

The components in the drawings are not necessarily to scale relative to each other. Like reference numerals designate corresponding parts throughout the several views.

DETAILED DESCRIPTION

Systems may require a filter for suppressing noise on a reference voltage. In order to achieve the required filtering performance for this suppression, an RC filter can require very large passive component values, which required too much area to implement on some integrated circuits. Using an active circuit can improve the filtering performance in a size that can be implemented with an integrated circuit but can introduce other problems and/or may not be suitable for low voltage operation. The present disclosure describes a noise filter that can provide the necessary filtering performance in a size suitable for an integrated circuit. Additionally, the disclosed noise filter does not suffer from the problems of other filtering approaches and can operate with low voltages.

Figure 1:
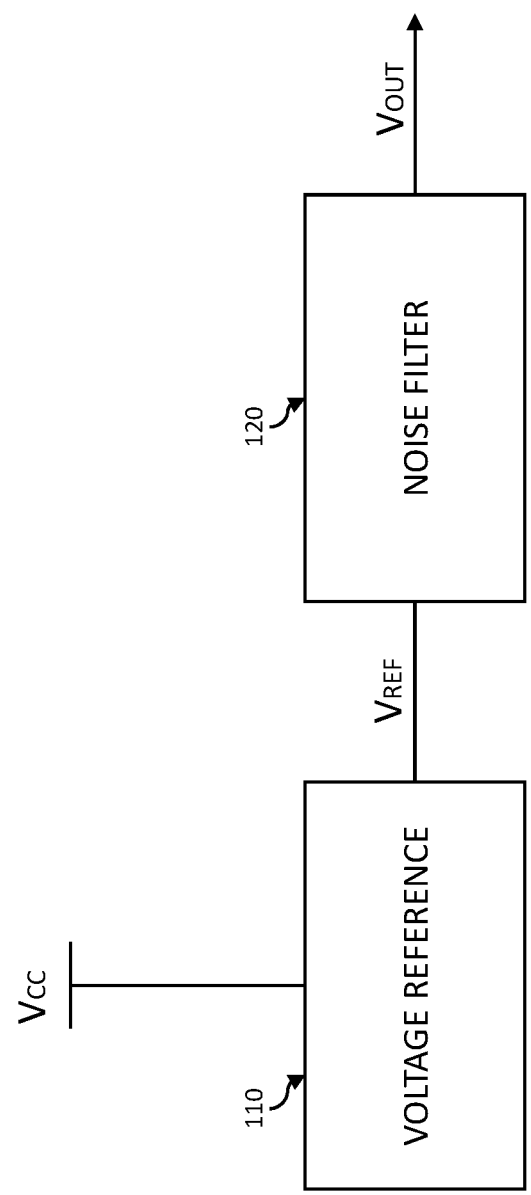
FIG. 1 illustrates a system including a noise filter according to a possible implementation of the present disclosure.

FIG. 1 illustrates a system including a noise filter according to a possible implementation of the present disclosure. As shown, a noise filter 120 may receive a reference voltage ($V_{REF}$) (i.e., input voltage) from a voltage reference circuit 110 (e.g., bandgap reference circuit) and process the reference voltage to output an output voltage ($V_{OUT}$) that has less noise than the input reference voltage ($V_{REF}$). The output voltage may be transmitted to an input of another component (e.g., amplifier) of another circuit (not shown). In this implementation, the noise filter 120 may be a low-pass filter (i.e., LP-filter) with a low cutoff frequency (e.g., 10 Hertz (Hz)).

An LP filter can be implemented as an RC-filter. FIG. 2A schematically illustrates a possible RC-filter. The RC-filter includes a resistor (R) and a capacitor (C) that are coupled between an input terminal 210 and an output terminal 215. The RC-filter is passive and is configured to pass frequencies from the input terminal 210 to the output terminal 215 that are below a cutoff frequency ($f_c$) determined by the resistor and the capacitor (i.e., $f_c=\frac{1}{2}\pi RC$). The RC filter is further configured to attenuate (e.g., short to ground) frequencies above the cutoff frequency so that they are reduced or eliminated at the output terminal 215. When the RC-filter is used as a noise filter for a voltage reference ($V_{REF}$) it may be desirable to set the cutoff frequency at a low frequency (e.g., 10 Hz) in order to output an output voltage ($V_{OUT}$) that has reduced high frequency noise.

To achieve the low cutoff frequency, the RC-filter may require the use of large components. For example, an RC-filter with a cutoff frequency of 10 Hz may require a 500 picofarad (pF) capacitance and a 32 mega-ohms (MΩ) resistance. The high resistance may require a very large area to implement on a die of an integrated circuit (IC). Accordingly, one problem associated with noise filters is creating a fully integrated noise filter IC (i.e., requiring no externally coupled components). Disclosed herein are circuits and techniques to create a fully integrated noise filter. While the fully integrated noise filter may be configured (e.g., have terminals) to accept external components (e.g., external capacitor, external resistor), these external components are not required because the fully integrated noise filter can operate without them.

Components other than resistors can be made to have a high resistance while requiring only a small area of an integrated circuit. For example, a diode or a transistor may appear to have a high resistance in an OFF (i.e., non-conducting) mode. FIG. 2B schematically illustrates a possible transistor-based RC-filter. The RC-filter includes a transistor 205 (Q) and a capacitor C. The transistor 205 can be configured to generate a high resistance between the input terminal 210 and the output terminal 215. The transistor can be a P-type metal oxide semiconductor field effect transistor (MOSFET) that is coupled to the input terminal 210 at its source terminal (S) and coupled to the output terminal 215 at its drain terminal (D). The transistor may further include a body terminal (B) (i.e., bulk terminal) that is coupled to the source terminal of the transistor. The transistor 205 further includes a gate terminal (G) that can be coupled to other circuitry, such as a current mirror (not shown). The other circuitry can be configured to bias the transistor 205 to provide a resistance between the source terminal (S) and the drain terminal (D), which can be used as the resistance of the RC-filter. One problem associated with using a transistor as a resistance in an RC-filter, is that the resistance provided by the transistor 205 may differ based on its direction. In other words, a resistance of the transistor may not be reciprocal (i.e., may be non-reciprocal).

As shown in FIG. 2B, when $V_{REF}$ is greater than $V_{OUT}$, a current may flow from the source terminal to the drain terminal, thereby experiencing a first resistance ($R_1(Q)$). When $V_{REF}$ is less than $V_{OUT}$, a current may flow from the drain terminal to the source terminal, thereby experiencing a second resistance ($R_2(Q)$). The second resistance may be lower than the first resistance due to a body effect of the transistor. In other words, lowering $V_{REF}$ can also lower a voltage (i.e., body voltage, bulk voltage) at the body terminal (B) of the transistor. Lowering the body voltage can lower the resistance between the drain terminal and the source terminal (i.e., the second resistance $R_2(Q)$). Accordingly, the RC filter including the transistor may respond to an input voltage disturbance differently than it responds to an output voltage disturbance.

A non-reciprocal resistance may have a non-reciprocal response to changes (i.e., disturbances) in the input/output voltage/current. One problem associated with an RC-filter having a resistance in one direction that is lower than in another direction (i.e., a non-reciprocal resistance) is a recovery time to a disturbance (e.g., due to electromagnetic interference (EMI)) can be longer than desired. Disclosed herein are circuits and techniques to create a noise filter using components other than a resistor that can quickly recover from a disturbance (e.g., voltage drop) at the input/output terminal. The recovery time can be small because the components can provide a resistance that is high to signals flowing from the input to the output and is also high to signals flowing from the output to the input (i.e., is reciprocal). Further, these components can be physically smaller than a resistor and therefore can be easier to implement as an integrated circuit.

Returning to FIG. 2B, the transistor may be biased to a particular operating point in order to provide a particular transistor-based resistance. The bias of the transistor may correspond to a threshold voltage ($V_T$) of the transistor, which can be determined (at least) by a transistor type (e.g., MOSFET), a transistor technology (e.g., P-type), and a configuration of the transistor (e.g., channel dimensions, body bias, etc.). One problem with using a transistor as a resistance is providing a proper bias in a low voltage application.

In some applications, it is desirable to use very low voltages that are comparable or less than a threshold voltage of a transistor. In these situations, a proper bias of the transistor cannot be achieved. For example, if the transistor is a P-type MOSFET (PMOS), when $V_{REF}=V_{OUT}=0.5V$ (i.e., C is charged), and $V_T=0.8V$, the transistor Q is non-conducting (i.e., OFF) and the filter cannot function. While techniques exist to create a low threshold voltage PMOS transistor, these techniques may include unwanted phenomena, such as an offset voltage and/or a leakage current that is higher than desired when implemented in a noise filter. Disclosed herein are circuits and techniques to provide a transistor-based resistance that can be used with very low voltages without the unwanted phenomena.

Figure 3:
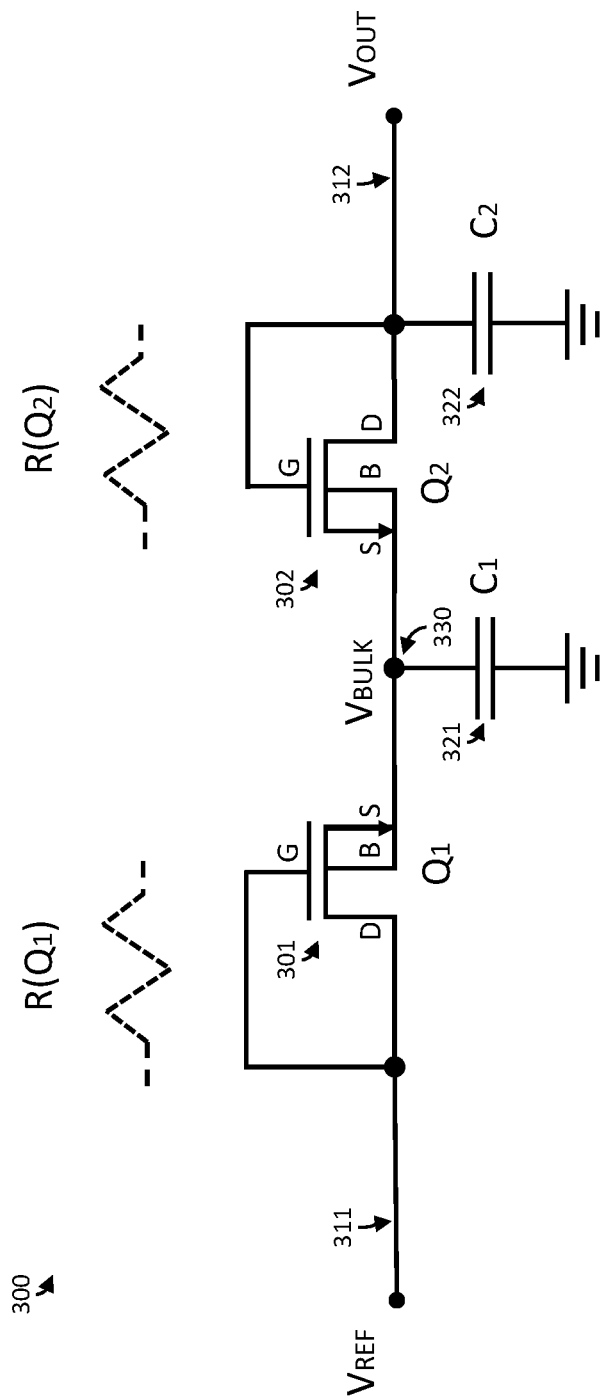
FIG. 3 schematically illustrates a noise filter according to a possible implementation of the present disclosure.

FIG. 3 illustrates a noise filter according to an implementation of the present disclosure. The noise filter 300 can be configured to provide a high resistance using components that are compatible with size constraints of an IC. The high resistance is reciprocal so that a low resistance in one direction does not negatively affect the recovery of the filter from voltage disturbances at the input/output. Further, the components and topology are compatible with low voltages.

The noise filter 300 includes a first transistor 301 (Q1) and a second transistor 302 (Q2). The first transistor 301 and the second transistor 302 are coupled between an input terminal 311 and an output terminal 312 in an anti-serial configuration (i.e., anti-serial topology). In other words, a current flowing from the input terminal 311 may flow into the drain terminal (D) of the first transistor 301 but will flow into the source terminal (S) of the second transistor 302. The first transistor 301 and the second transistor 302 can be N-type MOSFET (NMOS) transistors. The body terminal (B) of the first transistor 301 and the body terminal (B) of the second transistor 302 are each coupled to source terminals (S) of respective transistors. The gate terminal (G) of the first transistor 301 is coupled to the drain terminal (D) of the first transistor 301. In other words, the gate terminal of the first transistor 301 is coupled to the input terminal 311 of the noise filter 300. The gate terminal (G) of the second transistor 302 is coupled to the drain terminal (D) of the second transistor 302. In other words, the gate terminal of the second transistor 302 is coupled to the output terminal 312 of the noise filter 300.

The source terminal (S) of the first transistor 301 and the source terminal (S) of the second transistor 302 are coupled together at a bulk node 330 (i.e., body node) of the noise filter 300. The first transistor 301 is diode-connected and can function like a first diode with an anode coupled to the input terminal 311 and a cathode coupled to the bulk node 330. The second transistor 302 is diode-connected and can function like a second diode with an anode coupled to the output terminal 312 and a cathode coupled to the bulk node 330.

The first transistor and the second transistor are not required to be matched but may be the same type. The configuration (i.e., anti-serial configuration) of the transistors can reduce the negative phenomena associated with lower threshold transistors. Accordingly, the transistors may both be a transistor type that has a low threshold voltage. The threshold voltage of the first transistor 301 and the second transistor 302 may be small (e.g., $V_T \approx 0V$) or slightly negative (e.g., $-0.5V \leq V_T \leq 0V$) to allow for operation with low voltages (e.g., $V_{IN} = V_{OUT} = 0.5V$). For example, when the threshold voltage of the transistors is slightly negative (e.g., $V_T \approx -0.1$ V), a gate voltage that is at or above zero volts will increase conduction (i.e., configure the transistor in an ON condition), while a gate voltage that is below zero (and below the threshold voltage) will decrease conduction (i.e., configure the transistor in an OFF condition).

The noise filter 300 may also include a first capacitor ($C_1$) and a second capacitor ($C_2$). The first capacitor 321 is coupled between the bulk node 330 and a ground, while the second capacitor 322 is coupled between the output terminal 312 and the ground. The first capacitor 321 and the second capacitor 322 may be particular capacitor components. In a possible implementation, however, the first capacitor 321 is a parasitic capacitance associated with the bulk node 330 and no particular capacitor component is required. The configuration of the first capacitor 321, the second capacitor 322, the first transistor 301, and the second transistor 302 configure the noise filter to respond to voltage disruptions at the input or the output in a similar (i.e., reciprocal) fashion.

A first resistance $R(Q_1)$ of the first transistor and a second resistance $R(Q_2)$ of the second transistor respond to a voltage disturbance at the input or output in opposite ways. When the first resistance $R(Q_1)$ is decreased, the second resistance $R(Q_2)$ is increased. Conversely, when the second resistance $R(Q_2)$ is decreased, the first resistance $R(Q_1)$ is increased. The complementary increase and the decrease of the resistance may balance each other so that the noise filter appears to an equivalent resistance ($R_{EQ}$) that is largely the same when the output voltage is larger than the input voltage ($V_{OUT} > V_{REF}$) and when the input voltage is larger than the output voltage ($V_{REF} > V_{OUT}$). In other words, the noise filter can respond largely the same to disturbances at the input as it does to disturbances at the output. Additionally, because the resistance is an equivalent resistance, the response of the noise filter is less susceptible to each transistor's particular operation (i.e. process variations) or response to temperature (i.e., temperature variations).

The operation of the noise filter 300 may be described based on its response to relative changes in the input voltage ($V_{REF}$) and the output voltage ($V_{OUT}$). When $V_{REF}$ is made larger than $V_{OUT}$ (i.e., $V_{REF} > V_{OUT}$), the first transistor 301 ($Q_1$) conducts (i.e., $R(Q_1)$ is low) so that the first capacitor 321 ($C_1$) is charged quickly. The second transistor 302 ($Q_2$) conducts very little initially (i.e., $R(Q_2)$ is high) so that the second capacitor 322 ($C_2$) is charged slowly (i.e., slower than the first capacitor). As the first capacitor 321 ($C_1$) is charged, the body voltage ($V_{BULK}$) of the second transistor 302 ($Q_2$) is increased, thereby causing the second transistor 302 ($Q_2$) to increase conduction (i.e., $R(Q_2)$ is reduced). In other words, the noise filter 300 responds to $V_{REF}$ being made higher than $V_{OUT}$ by quickly charging $C_1$ and slowly charging $C_2$.

In a steady state (i.e., charged state), the capacitors ($C_1$, $C_2$) are both charged (e.g., $V_{REF} \approx V_{OUT}$) and the transistors both conduct ($R(Q_1) \approx R(Q_2)$). If in the steady state, $V_{REF}$ is made smaller than $V_{OUT}$ (i.e., $V_{REF} < V_{OUT}$), the second transistor 302 ($Q_2$) conducts (i.e., $R(Q_2)$ is low). The first transistor 301 ($Q_1$) conducts very little initially (i.e., $R(Q_1)$ is high), blocking a sudden discharge of the first capacitor 321 ($C_1$). In other words, the noise filter 300 responds to $V_{REF}$ being made lower than $V_{OUT}$ by slowly discharging $C_1$.

The slow charging and discharging in response to disturbances at the input/output corresponds to a low pass filter with a long time constant (i.e., high resistance). The long time constant prevents a disturbance in input voltage or output voltage from significantly draining either capacitor of its charge. Accordingly, the noise filter can return from a discharged state back to the steady state (i.e. charged state) in a relatively short time after the disturbance.

Figure 4:
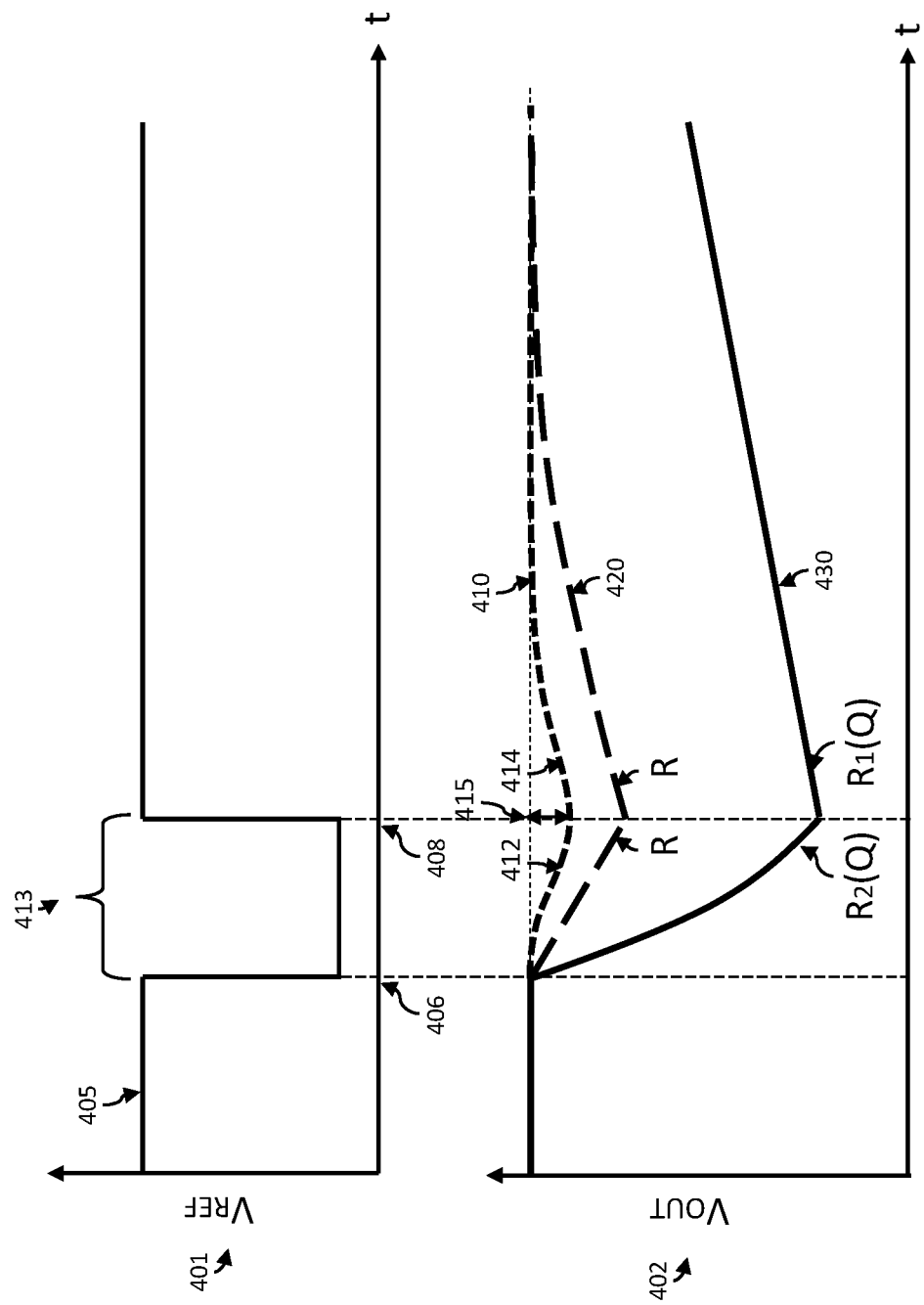
FIG. 4 illustrates a comparison of a time response of an implementation of the noise filter as compared with other filters.

FIG. 4 illustrates a comparison of a time response of an implementation of the noise filter (see FIG. 3) as compared with other filters (see FIGS. 2A, 2B). An input voltage ($V_{REF}$) is shown in a first graph 401, The input voltage ($V_{REF}$) experiences a disturbance 413 (i.e., drop) in the input voltage ($V_{REF}$) that begins at a first time 406 and continues to a second time 408 at which point it returns to a steady state 405 (e.g., $V_{REF} = V_{OUT}$).

An output voltage ($V_{OUT}$) is shown in a second graph 402, which shares the same time axis as the first graph 401. The second graph 402 includes output voltage responses from three different filters to the disturbance in the input voltage. A first response 410 is from the noise filter shown in FIG. 3, a second response 420 is from the reciprocal RC-filter shown in FIG. 2A, and a third response 430 is from the non-reciprocal RC-filter shown in FIG. 2B.

In the first response 410, at the first time 406, a relatively slow decrease 412 in the output voltage ($V_{OUT}$) begins because, as described previously, the noise filter (see FIG. 3) responds to the drop in the input voltage by slowly discharging the first capacitor 321 ($C_1$). At a second time 408, the first response 410 of the output voltage ($V_{OUT}$) begins an increase 414 back to a steady state value. The increase results because the noise filter (see FIG. 3) responds to the increase in the input voltage at the second time 408 by slowly charging the second capacitor 322 ($C_2$). The discharging rate and charging rate are approximately the same because the resistance of the noise filter is reciprocal. In other words, the discharging rate and the charging rate are balanced by transistors ($Q_1$, $Q_2$), which are configured to respond to the disturbance in complimentary fashion. Because the transistors ($Q_1$, $Q_2$) can provide a very high resistance, a magnitude 415 of the disturbance is minimized.

The second graph 402 also includes a second response of the reciprocal RC-filter (see FIG. 2A). As can be observed from the second response 420, the charging and discharging of $V_{OUT}$ are symmetric. The symmetry results from the resistance (R) of the RC-filter being reciprocal and is similar to the symmetry observed in the first response 410.

The second graph 402 also includes a third response 430 from the non-reciprocal RC-filter (see FIG. 2B). As can be observed from the third response 430, the charging and discharging of $V_{OUT}$ are not symmetric. The asymmetry results from the resistance of the transistor being lower in one direction than another direction (R2(Q)<R1(Q)). Accordingly, the magnitude 415 the disturbance is large and slow to recover.

Figure 5:
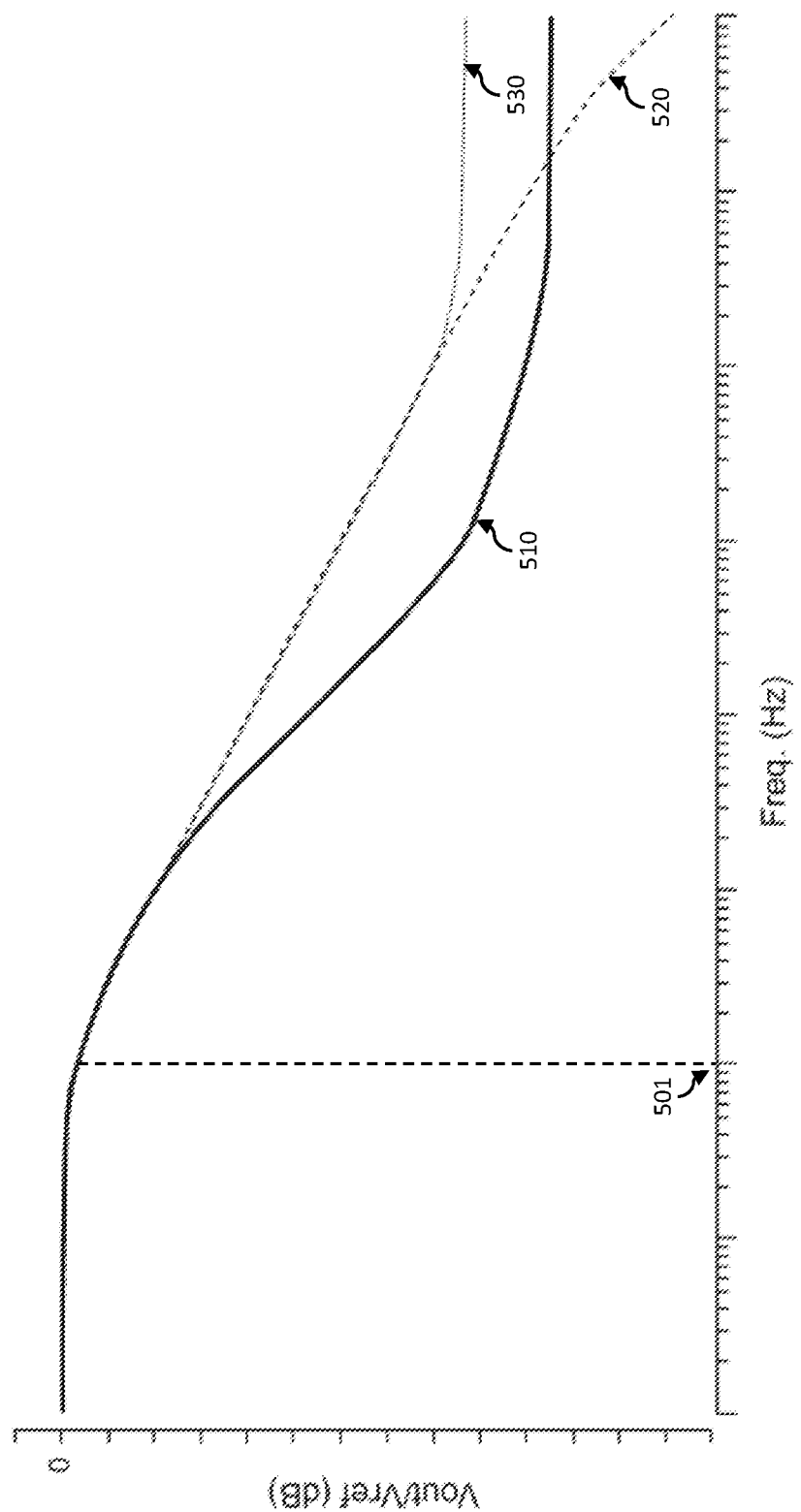
FIG. 5 illustrates a comparison of a frequency response of an implementation of the noise filter as compared with other filters.

FIG. 5 illustrates a comparison of a frequency response of an implementation of the noise filter (see FIG. 3) as compared with other filters (see FIGS. 2A, 2B). The frequency (horizontal) axis of the graph is logarithmic and the transmission (i.e., $V_{OUT}/V_{REF}$) axis is given in decibels (dB). A first frequency response 510 is from the noise filter (e.g., FIG. 3), a second frequency response 520 is from the reciprocal RC-filter (e.g., FIG. 2A), and the third frequency response 530 is from the non-reciprocal RC-filter (e.g., FIG. 2B). As shown, all three filters operate as low-pass (LP) filters configured to pass frequencies below (i.e., less than) a cutoff frequency 501 (fc) and attenuate (i.e. block) frequencies above (i.e., greater than) the cutoff frequency 501. For example, the cutoff frequency 501 may be 10 Hz. As shown, the first frequency response 510 of the noise filter (FIG. 3) can have better blocking at lower frequencies than the other filters because the noise filter operates as a higher order filter.

Thus far, the noise filter of FIG. 3 has been assumed to be at a steady state. The steady state occurs after the first capacitor 321 and the second capacitor 322 are charged. Due to the resistance of the first transistor 301, the charging of the first capacitor 321 may be slow. Further, the resistance of the second transistor 302 may make charging the second capacitor 322 even slower than the charging of the first capacitor 321. Accordingly, the noise filter may include a start-up circuit configured to charge the first capacitor and the second capacitor when power is applied to the circuit for operation (i.e., at a start-up time).

Figure 6:
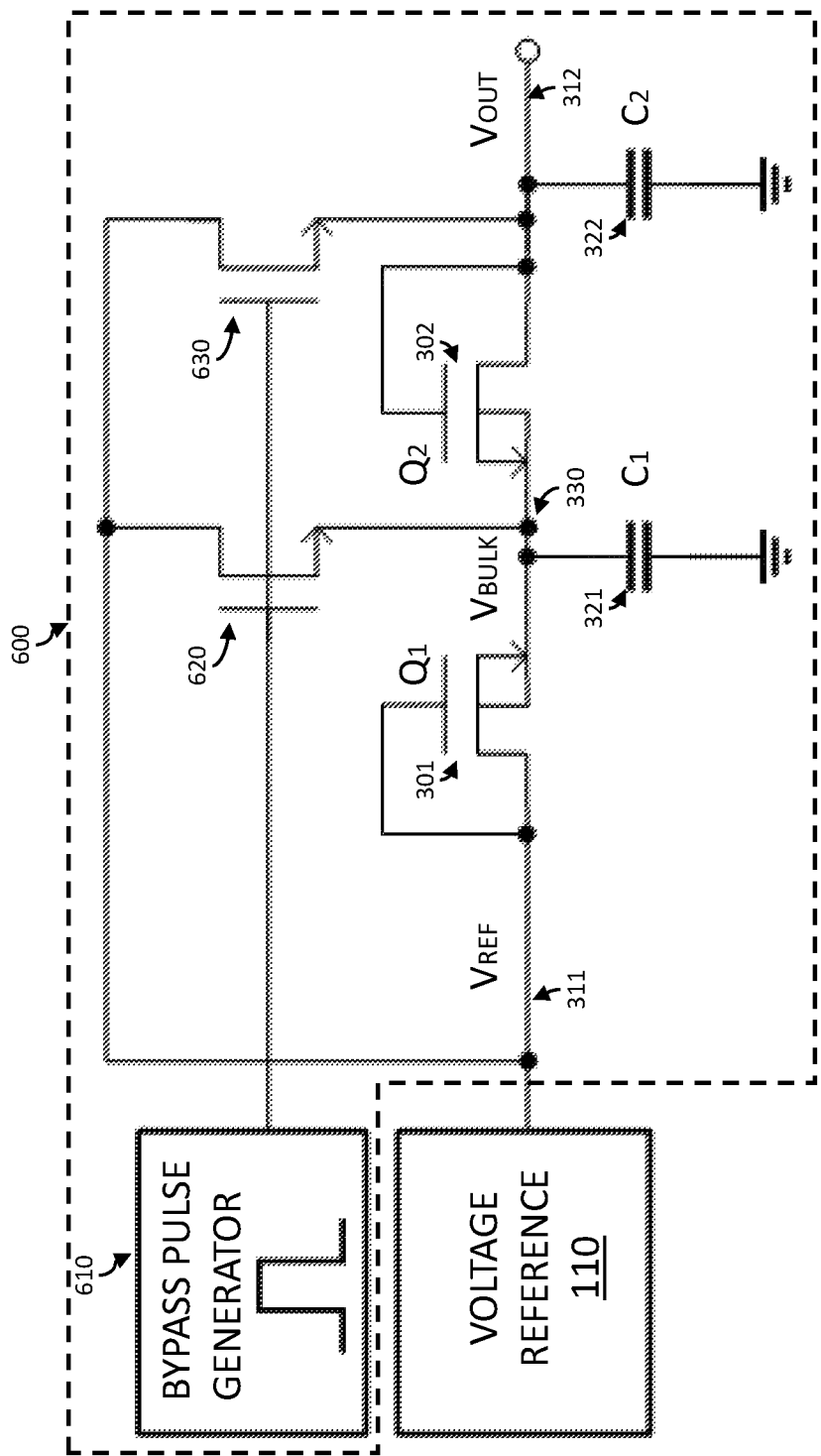
FIG. 6 schematically illustrates a noise filter with an added start-up circuit according to a possible implementation of the present disclosure.

FIG. 6 schematically illustrates a noise filter 600 with an added start-up circuit according to a possible implementation of the present disclosure. The start-up circuit can include a first bypass transistor 620 and a second bypass transistor 630. The start-up circuit can also include a bypass pulse generator 610 configured to output a signal to a gate of the first bypass transistor 620 and to a gate of the second bypass transistor 630. The signal can configure the first bypass transistor 620 and the second bypass transistor 630 to be ON (i.e., conduct) during a start-up period and to be OFF (i.e., not conduct) otherwise. When ON (i.e., in an ON condition), the first bypass transistor 620 couples the input voltage ($V_{REF}$) to the bulk node 330 so that the first capacitor 321 can be quickly charged. When ON, the second bypass transistor 630 couples the input voltage ($V_{REF}$) to the output terminal 312 so that the second capacitor 322 can be quickly charged. After the first capacitor 321 and the second capacitor 322 are charged (i.e., in a steady state), the signal from the bypass pulse generator can configure the first bypass transistor 620 and the second bypass transistor 630 to be OFF (i.e., not conduct) and the start-up circuit is decoupled from the noise filter. When the first bypass transistor 620 and the second bypass transistor 630 are OFF, the noise filter 600 operates as described previously for FIG. 3.

The signal generated by the bypass pulse generator 610 may be triggered at a start-up variously. For example, an input voltage applied to the noise filter 600 may trigger the signal. The signal may be a pulse of a fixed duration. Alternatively, the signal may by a pulse that is triggered to end based on states of the capacitors. For example, the bypass pulse generator 610 may monitor the output voltage and may trigger the pulse to end when the output voltage exceeds a threshold voltage.

Figure 7:
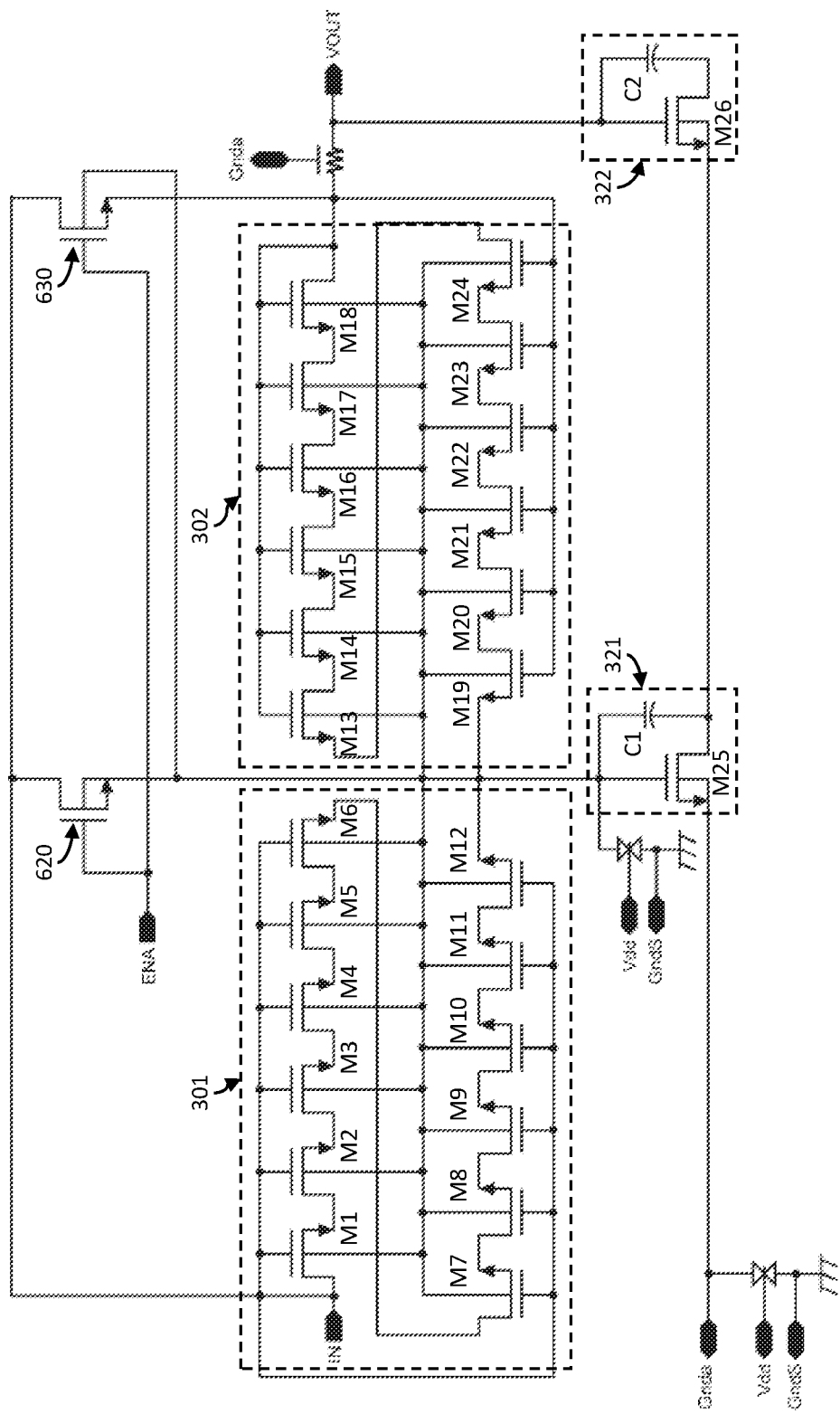
FIG. 7 illustrates a detailed schematic of a noise filter according to a possible implementation of the present disclosure.

FIG. 7 illustrates a detailed schematic of a noise filter according to a possible implementation of the present disclosure. The implementation of the noise filter shown in FIG. 7 may operate similarly to the noise filter shown in FIG. 6 but includes possible variations related to a practical implementation. For example, the first transistor 301 may be implemented as a plurality of series-connected transistors (M1, M2, M3, M4, M5, M6, M7, M8, M9, M10, M11, M12). In other words, adjacent pairs of transistors in the plurality may have a source terminal of a first transistor coupled to a drain terminal of a second transistor. Likewise, the second transistor 302 may be implemented as a plurality of series-connected transistors (M13, M14, M15, M16, M17, M18, M19, M20, M21, M22, M23, M24). The plurality of transistors may be used to increase a resistance when a resistance of each transistor is constrained. For example, a practical transistor design may include a limit on a channel length, which can limit its resistance. In another example, the first capacitor 321 may include a metal plate capacitor (C1) and a gate capacitance of a transistor (M25), which combine to form a first capacitance. Likewise, the second capacitor 322 may include a metal plate capacitor (C0) a gate capacitance of a transistor (M26), which combine to form a second capacitance. The combination of the metal plate capacitor and the transistor may be used in a practical implementation because they may improve the capacitance possible for a particular area on the IC. In other words, they may be stacked in layers of an integrated circuit to conserve area while providing additional capacitance. The present disclosure recognizes that other practical variations can exists to provide the function of the noise filter described herein.

Figure 8:
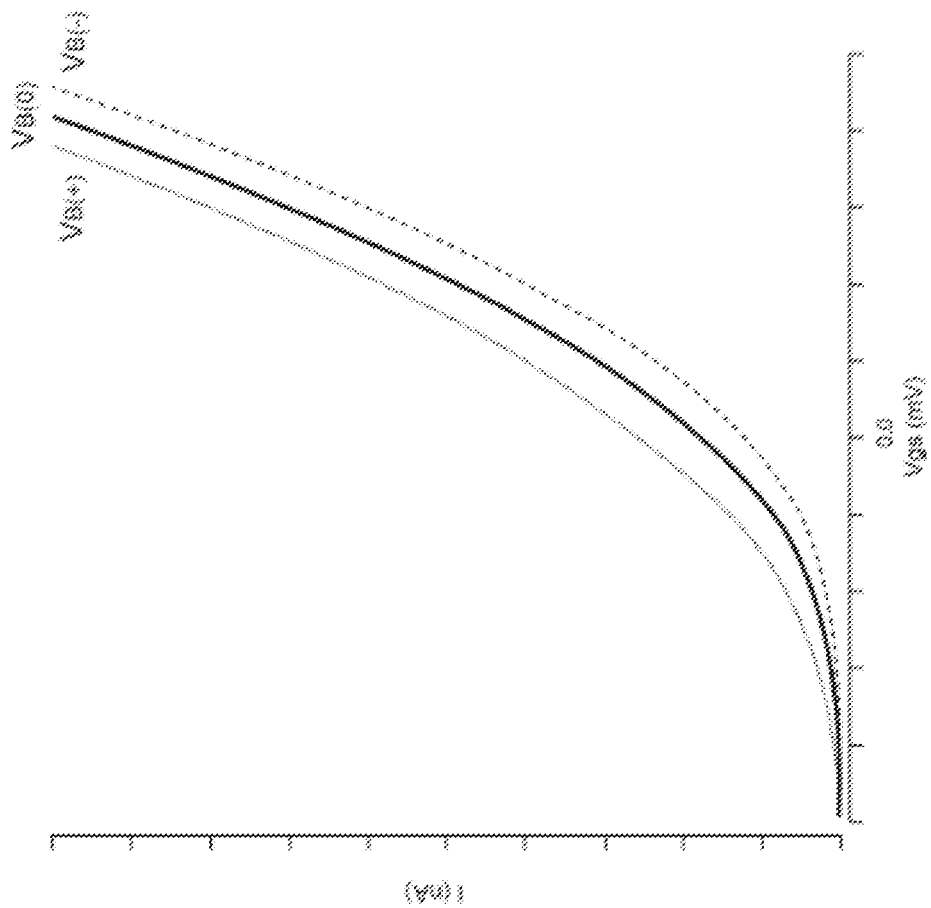
FIG. 8 illustrates response curves of a transistor suitable for use with the noise filter of the present disclosure.

As mentioned, the noise filter may include n-type MOSFET transistors (i.e. NMOS transistors) of a technology suitable for providing a near zero threshold voltage or a negative threshold voltage. For example, the transistors may be a native threshold depletion (NVT) transistor. The NVT transistor may have a negative or zero threshold voltage that allows the transistors to conduct at zero volts. FIG. 8 illustrates a graph of current (I) versus gate-source voltage (Vgs) for an NVT transistor. As shown, for a gate-source voltage of zero, the transistor conducts current and a negative gate-source voltage is required to turn OFF the transistor. The graph plots three curves. Each curve represents operation of the NMOS transistor at a different body voltage. The graph shows that when the NMOS transistor is ON, then a body-bias voltage (i.e. $V_{BULK}$) can be used to change the current through the transistor. In other words, the transistors can be configured to operate as voltage-controlled resistances.

Figure 9:
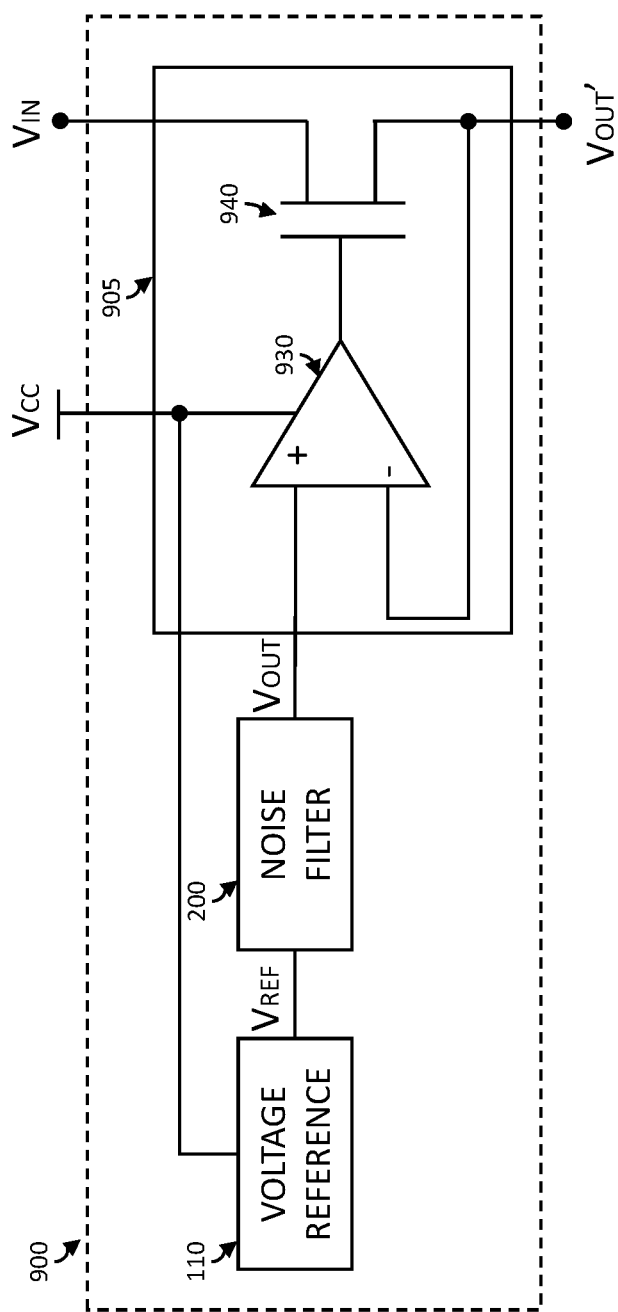
FIG. 9 illustrates a system for regulating a voltage including a noise filter according to a possible implementation of the present disclosure.

The disclosed noise filter may be used in a variety of applications. FIG. 9 illustrates a system for regulating a voltage. The system 900 is configured to provide a regulated output voltage (i.e., $V_{OUT}'$) based on an input voltage (i.e., $V_{IN}$) and a supply voltage (i.e., $V_{CC}$). The system 900 includes a low dropout regulator (i.e., LDO 905). The LDO 905 includes a transistor 940 that can be configured by a voltage applied to a gate terminal to generate a voltage drop across the transistor so that the output voltage ($V_{OUT}'$) is fixed at a regulated level. The LDO 905 includes an error amplifier (i.e., difference amplifier 930) that is configured to control the transistor gate voltage based on a comparison between the output voltage of the LDO ($V_{OUT}'$) and a reference level ($V_{OUT}$) so the voltage drop across the transistor 940 may be adjusted to keep the output voltage ($V_{OUT}'$) regulated even as the input voltage ($V_{IN}$) changes.

A quality of the regulated output voltage ($V_{OUT}'$) can correspond to a quality of the reference level ($V_{OUT}$). Accordingly, supplying a high-quality reference level ($V_{OUT}$) to the difference amplifier 930 may be highly desirable in some applications. For example, in one possible application (e.g., 5G communication), the LDO output is required to have ultra-low noise (e.g., 4 micro-Volts-rms ($\mu V_{rms}$) at 10 Hz per 100 kilohertz (kHz) and operate over an extended temperature range (e.g., up to 150 degrees an Celsius (° C.). For applications such as this, the system 900 meet or exceed the noise requirements by including a noise filter 200. As shown in FIG. 9, the noise filter is coupled to a voltage reference circuit 110 (e.g., bandgap reference circuit) of the system. The noise filter 200 is configured to receive an unfiltered reference voltage ($V_{REF}$). The unfiltered reference voltage ($V_{REF}$) includes a zero frequency (i.e., DC) component but can also include higher frequency components (i.e., noise). The noise filter is configured to pass the DC reference voltage and attenuate noise above a (low) cutoff frequency (e.g. 10 Hz). Accordingly, the noise filter 200 is configured to output a filtered reference voltage ($V_{OUT}$) to the difference amplifier 930 that has less noise than the unfiltered reference voltage ($V_{REF}$). Accordingly, less noise can result in the regulated output voltage of the LDO.

The disclosed noise filter has a filtering performance (e.g., recovery from EMI disturbances, $F_{cutoff}$=10 Hz, etc.) at least as good as a conventional RC-filter, while being much smaller (e.g., 10× smaller) than an RC-filter using a conventional resistor. Thus, the system 900 can be integrated in an IC package (i.e., in the same integrated circuit package) without requiring any added external components (e.g., external resistor) for filtering. The disclosed noise filter also has input and output impedances that are approximately (e.g., within 1 percent of each other) equal. The equal input and output impedances (i.e., reciprocal impedances) enhance power-supply rejection, reverse current protection, and system stability. For example, the noise filter can quickly recover from a disturbance at the input of the filter. The system can be used with a supply voltage below 1 voltage and can efficiently output a regulated voltage of 0.5v.

Figure 10:
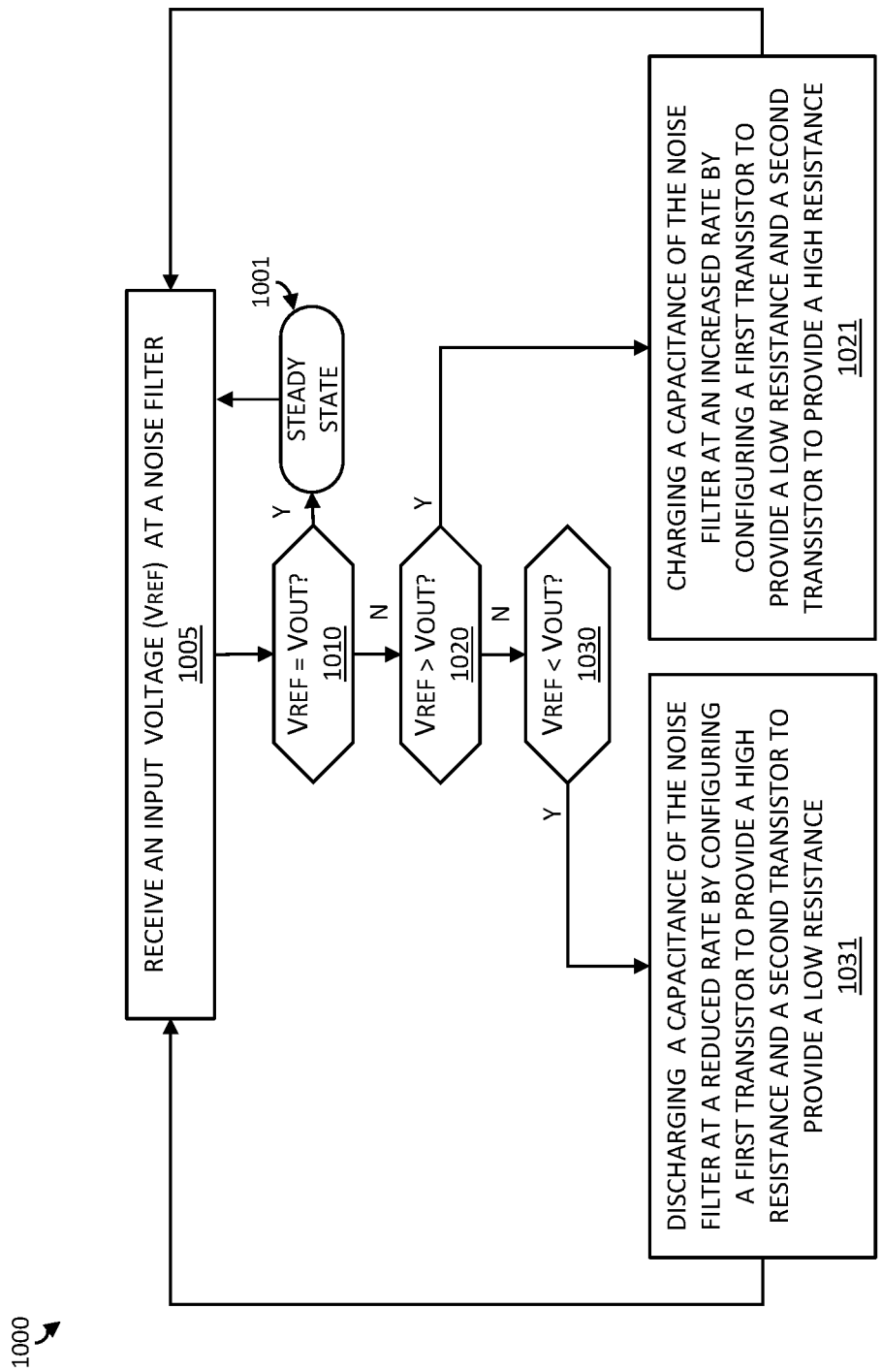
FIG. 10 illustrates a method for noise filtering according to a possible implementation of the present disclosure.

FIG. 10 illustrates a flowchart of a method for noise filtering. The flowchart describes the function of an analog circuit, such as shown in FIG. 6, which does not require sequential logic or a state machine. The method 1000 includes receiving 1005 an input voltage ($V_{REF}$) at a noise filter (e.g., as illustrated in FIG. 6). The noise filter includes a capacitance and a resistance. The capacitance can be provided by a first capacitor and a second capacitor and the resistance can be provided by a first transistor and a second transistor. In a possible implementation, an input terminal of the noise filter is coupled through the first transistor to a first capacitor. The first capacitor is coupled through a second transistor to a second capacitor at an output terminal. At a steady state (i.e., in a steady state condition 1001) the capacitors are charged and the voltages at the input terminal (i.e., $V_{REF}$) and the output terminal (i.e., $V_{OUT}$) are equal (i.e., $V_{REF}$=$V_{OUT}$). In other words, the noise filter is at steady state. For example, at a start-up (e.g., the application of power) the first capacitor and the second capacitor can be charged (e.g., by a start-up circuit) so that the output voltage equals the input voltage (i.e., charged to the steady state).

In the steady state condition 1001, the capacitance of the noise filter is charged so that the input voltage equals the output voltage ($V_{REF}$=$V_{OUT}$). When the input voltage is made higher than the output voltage (i.e., $V_{REF}$>$V_{OUT}$ 1020), the first transistor can be configured to provide a low resistance (i.e., relative to a high resistance) and second transistor can be configured to provide the high resistance (i.e., relative to the low resistance). The resistances provided may increase a rate that the capacitance (e.g., the first capacitor) of the noise filter is charged 1021. In other words, the voltage condition ($V_{REF}$>$V_{OUT}$) can automatically increase a rate at which the noise filter can return to the steady state condition 1001 by adjusting the resistances provided by the transistors (i.e., reducing a first resistance provided by the first transistor).

As mentioned, in the steady state condition, the capacitance of the noise filter is charged so that input voltage equals the output voltage ($V_{REF}$=$V_{OUT}$). When the input voltage is made lower than the output voltage (i.e., $V_{REF}$<$V_{OUT}$ 1030), the second transistor can be configured to provide a low resistance (i.e., relative to a high resistance) and the first transistor can be configured to provide the high resistance (i.e., relative to the low resistance). The resistances provided may reduce a rate that the capacitance (e.g., the first capacitor and the second capacitor) of the noise filter is discharged 1031. In other words, the voltage condition ($V_{REF}$<$V_{OUT}$) can automatically reduce a rate at which the noise filter departs from the steady state condition 1001 by adjusting the resistances provided by the transistors (i.e., maintaining a high first resistance provided by the first transistor). In this way, the noise filter can respond quickly to voltage disruptions (e.g., spikes).

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A noise filter, comprising:
a first transistor coupled between an input terminal and a bulk node, the first transistor having a first gate terminal coupled to the input terminal and a first body terminal coupled to the bulk node;
a first capacitor coupled between the bulk node and a ground;
a second transistor coupled between the bulk node and an output terminal, the second transistor having a second gate terminal coupled to the output terminal and a second body terminal coupled to the bulk node; and
a second capacitor coupled between the output terminal and the ground.

2. The noise filter according to claim 1, wherein the first transistor and the second transistor are n-type metal oxide semiconductor field effect transistors (MOSFETs) having a negative or zero threshold voltage.

3. The noise filter according to claim 2, wherein the n-type MOSFETs are native threshold depletion (NVT) transistors.

4. The noise filter according to claim 1, wherein the first transistor or the second transistor is implemented as a plurality of series-connected transistors.

5. The noise filter according to claim 1, wherein the first capacitor is coupled in parallel with a capacitance generated by a third transistor and the second capacitor is coupled in parallel with a capacitance generated by a fourth transistor.

6. The noise filter according to claim 1, wherein the first transistor and the second transistor define a resistance of the noise filter.

7. The noise filter according to claim 6, wherein the resistance is reciprocal so that the resistance from the input terminal to the output terminal is the same as the resistance from the output terminal to the input terminal.

8. The noise filter according to claim 1, wherein the first transistor, the first capacitor, the second transistor, and the second capacitor are configured to pass signals at frequencies below a cutoff frequency and to attenuate signals at frequencies above the cutoff frequency.

9. The noise filter according to claim 8, wherein the cutoff frequency is 10 Hertz (Hz).

10. The noise filter according to claim 1, further including a start-up circuit configured to charge the first capacitor and the second capacitor at a start-up time.

11. The noise filter according to claim 10, wherein the start-up circuit includes:
a first bypass transistor coupled between the input terminal and the first capacitor;
a second bypass transistor coupled between the input terminal and the second capacitor; and
a bypass pulse generator configured to control the first bypass transistor and the second bypass transistor into an ON condition to charge the first capacitor and the second capacitor or an OFF condition to decouple the start-up circuit from the noise filter.

12. The noise filter according to claim 1, wherein the first transistor, the first capacitor, the second transistor, and the second capacitor are included within in an integrated circuit package.

13. A system for regulating a voltage, the system comprising:
a low-dropout voltage regulator (LDO) configured to compare a filtered reference voltage to an output voltage;
a voltage reference configured to generate an unfiltered reference voltage; and
a noise filter configured to receive the unfiltered reference voltage and to generate the filtered reference voltage, the noise filter including:
a first transistor coupled between an input terminal and a bulk node, the first transistor having a first gate terminal coupled to the input terminal and a first body terminal coupled to the bulk node;
a first capacitor coupled between the bulk node and a ground;
a second transistor coupled between the bulk node and an output terminal, the second transistor having a second gate terminal coupled to the output terminal and a second body terminal coupled to the bulk node; and
a second capacitor coupled between the output terminal and the ground.

14. The system according to claim 13, wherein the first transistor and the second transistor are native threshold depletion (NVT) transistors.

15. The system according to claim 13, wherein:
the first transistor generates a first resistance between the input terminal and the bulk node; and
the second transistor generates a second resistance between the bulk node and the output terminal.

16. The system according to claim 15, wherein:
the first resistance is lower than the second resistance when an input voltage at the input terminal is higher than an output voltage at the output terminal; and the first resistance is higher than the second resistance when the input voltage at the input terminal is lower than the output voltage at the output terminal.

17. The system according to claim 13, wherein the noise filter further includes a start-up circuit configured to charge the first capacitor and the second capacitor.

18. A method for noise filtering, comprising:
receiving an input voltage at a noise filter, the noise filter including a capacitance and a first resistance generated by a first transistor and a second resistance generated by a second transistor;
configuring the first resistance lower than the second resistance to increase a charging rate of the capacitance when the input voltage is made larger than an output voltage; and
configuring the resistances provided by the first transistor and the second transistor first resistance higher than the second resistance to decrease a discharging rate of the capacitance when the input voltage is made smaller than the output voltage.

19. The method for noise filtering according to claim 18, further comprising:
charging the capacitance at a start-up so that the output voltage equals the input voltage.

* * * * *